United States Patent [19]
Opris et al.

[11] Patent Number: 5,973,897
[45] Date of Patent: Oct. 26, 1999

[54] ELECTROSTATIC DISCHARGE (ESD) PROTECTION CIRCUIT WITH REDUCED NODE CAPACITANCE

[75] Inventors: Ion E. Opris; Joseph Biran, both of Sunnyvale, Calif.

[73] Assignee: National Semiconductor Corporation, Santa Clara, Calif.

[21] Appl. No.: 08/890,106

[22] Filed: Jul. 9, 1997

[51] Int. Cl.[6] .................................................. H02H 9/00
[52] U.S. Cl. .......................... 361/56; 361/58; 361/111; 361/118
[58] Field of Search .................... 361/56, 58, 91, 361/111, 113, 117, 118, 119, 127

[56] References Cited

U.S. PATENT DOCUMENTS 5,563,757  10/1996  Corsi ........................................... 361/56

*Primary Examiner*—Jeffrey Gaffin
*Assistant Examiner*—Stephen Jackson
*Attorney, Agent, or Firm*—Limbach & Limbach L.L.P.

[57] ABSTRACT

An electrostatic discharge (ESD) protection circuit with reduced high frequency signal distortion includes an additional input shunting diode and a voltage follower amplifier. This second diode and the original input shunting diode are connected in series between the circuit node to be protected and circuit ground so as to limit the voltage level at such node during an ESD event. The voltage follower amplifier maintains a substantially constant voltage across this second diode, thereby maintaining a substantially constant diode junction capacitance. Hence, with the introduction of this additional, serially connected junction capacitance of the second diode, the nonlinear input capacitance responsible for input signal distortion is reduced, plus with a substantially constant diode junction capacitance due to the use of the voltage follower amplifier, such reduced capacitance remains substantially more constant over variations in the input signal voltage.

20 Claims, 4 Drawing Sheets

ELECTROSTATIC DISCHARGE (ESD) PROTECTION CIRCUIT WITH REDUCED NODE CAPACITANCE

1. FIELD OF THE INVENTION

The present invention relates to electrostatic discharge (ESD) protection circuits, and in particular, to ESD protection circuit implemented with non-linear capacitive elements, such as reverse biased diodes.

2. DESCRIPTION OF THE RELATED ART

Typical ESD protection circuits use diodes which are connected in a shunting configuration with respect to the circuit pad intended to be protected. Such diodes are operated in a reverse biased mode and, therefore, have a non-linear capacitance in the form of a reverse biased pn junction. This non-linear input capacitance interacts with the finite impedance of the input signal source (e.g., 50 ohms) and thereby causes signal distortion at higher frequencies. This signal distortion becomes increasingly intolerable as the frequencies of the input signals increase, and even more so as the signal strengths decrease with the use of lower power circuitry.

Referring to FIG. 1, simple ESD protection can be implemented with a Zener diode DZ as shown. The junction capacitance $C_{DZ}$ of the diode DZ will vary in a non-linear manner with the signal voltage $V_{SP}$ at the pad P. For example, with a nominal capacitance $C_{DZ}$, i.e., at zero bias, of 2.2 picofarad, and a reduced capacitance $C_{DZ}$ of 1.1 picofarad with maximum reverse bias and a source resistance $R_S$ of 50 Ohms, total harmonic distortion at an input frequency of 10 Megahertz is approximately −62.7 decibels. For an analog-to-digital converter, this amount of distortion limits its linearity to approximately 10 bits of resolution. Moreover, a nominal capacitance $C_{DZ}$ of only 2.2 picofarad is optimistic; therefore, distortion can be and is often significantly greater.

Referring to FIG. 2, another common ESD protection circuit uses two ordinary diodes D1, D2 connected between the pad P and the power supply rail VDD and circuit ground VSS/GND. However, the above-discussed distortion introduced by the non-linear capacitances $C_{D1}$, $CD_{D2}$ of these diodes D1, D2 still exists.

Accordingly, it would be desirable to have an ESD protection circuit which has the simplicity of conventional diode based ESD protection circuits but with reduced distortion due to the non-linear capacitances of such diodes.

SUMMARY OF THE INVENTION

An ESD protection circuit in accordance with the present invention introduces a reduced pad capacitance with a significantly more linear capacitance versus voltage characteristic.

In accordance with one embodiment of the present invention, an electrostatic discharge (ESD) protection circuit with a reduced node capacitance which is more linear over variations in input signal voltage includes a reference node, a signal node, a bias node, two impedance elements and an amplifier. The reference node is configured to establish a first circuit reference potential. The signal node is configured to receive and convey a signal voltage relative to the first circuit reference potential. The bias node is configured to receive and convey a bias voltage relative to the first circuit reference potential. The first impedance element is coupled between the signal node and the bias node and includes a capacitance which is dependent upon a difference between the signal voltage and the bias voltage. The second impedance element is coupled between the bias node and the reference node and includes a capacitance which is dependent upon a difference between the bias voltage and the first circuit reference potential. The first and second impedance elements together become conductive when the signal voltage transcends a predetermined threshold potential relative to the first circuit reference potential. The amplifier is coupled between the signal node and the bias node and is configured to receive the signal voltage and in accordance therewith provide the bias voltage. The difference between the signal voltage and the bias voltage remains substantially constant for signal voltage magnitudes between the first circuit reference potential and a second circuit reference potential.

In accordance with another embodiment of the present invention, such an ESD protection circuit further includes a second reference node, a second bias node and two additional impedance elements. The second reference node is configured to establish the second circuit reference potential relative to the first circuit reference potential. The second bias node is configured to receive and convey a second bias voltage relative to the second circuit reference potential. The third impedance element is coupled between the signal node and the second bias node and includes a capacitance which is dependent upon a difference between the signal voltage and the second bias voltage. The fourth impedance element is coupled between the second bias node and the second reference node and includes a fourth capacitance which is dependent upon a difference between the second bias voltage and the second circuit reference potential. The third and fourth impedance elements together become conductive when the signal voltage transcends a second predetermined threshold potential relative to the second circuit reference potential. The amplifier is further coupled between the signal node and the second bias node and is further configured to receive the signal voltage and in accordance therewith provide the second bias voltage. The difference between the signal voltage and the second bias voltage remains substantially constant for the signal voltage magnitudes between the first and second circuit reference potentials.

These and other features and advantages of the present invention will be understood upon consideration of the following detailed description of the invention and the accompanying drawings.

DETAILED DESCRIPTION OF THE INVENTION

Figure 1:
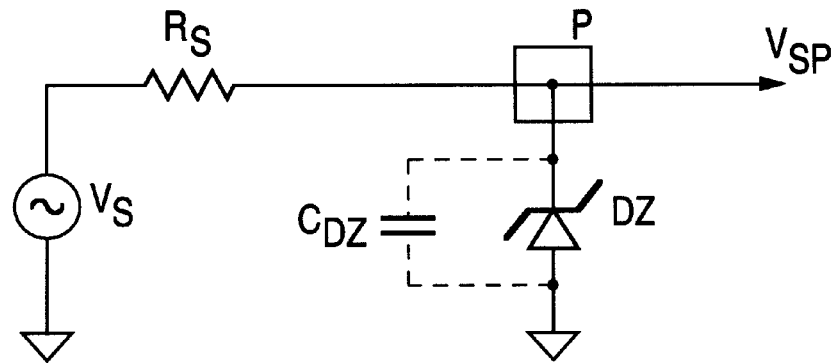
FIG. 1 is a schematic representation of a conventional ESD protection circuit using a Zener diode.
Figure 2:
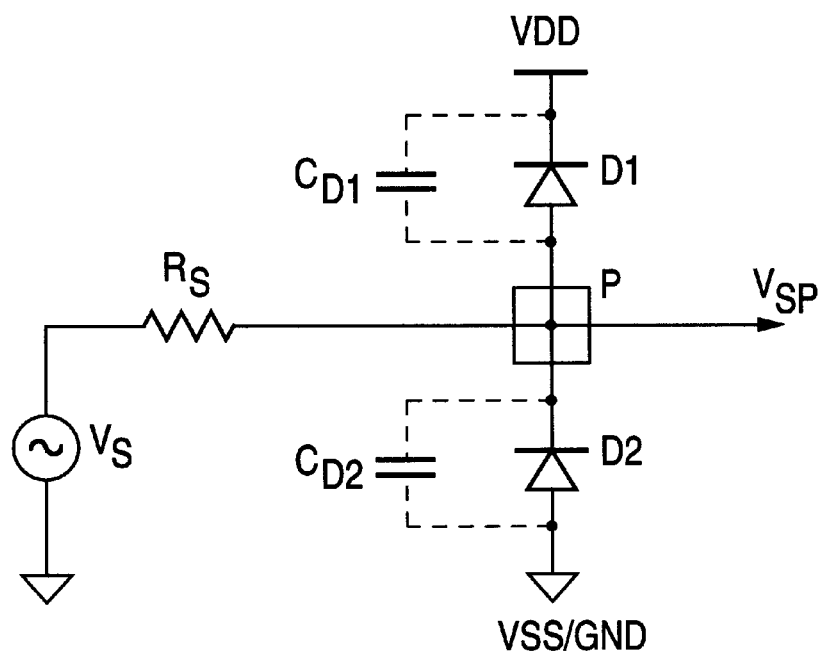
FIG. 2 is a schematic representation of a conventional ESD protection circuit using ordinary diodes between the circuit pad and the power supply nodes.
Figure 3:
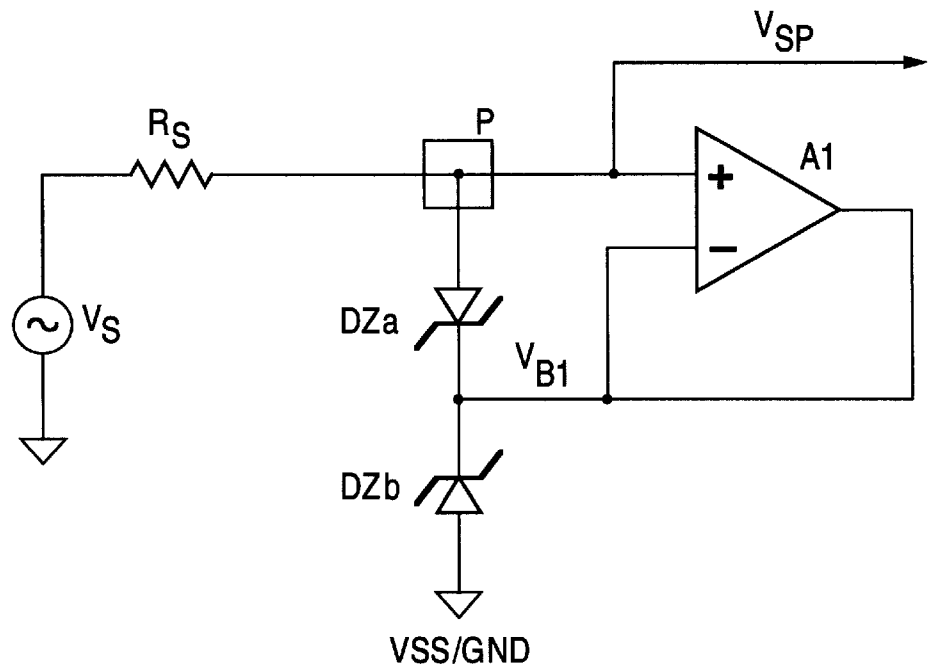
FIG. 3 is a schematic representation of an ESD protection circuit with reduced node capacitance in accordance with one embodiment of the present invention.

Referring to FIG. 3, an ESD protection circuit in accordance with one embodiment of the present invention includes two Zener diodes DZa, DZb connected back-to-back in series and shunting the circuit pad P intended to be protected. The first diode DZa is "bootstrapped" in that a voltage follower amplifier A1 generates a bias voltage $V_{B1}$ which is approximately equal to the signal voltage $V_{SP}$ at the pad P. The ESD protection mechanism is unchanged, i.e., for either polarity of an input ESD signal $V_{SP}$ voltage at the pad P, one of the diodes DZa, DZb is forward biased while the other is in Zener breakdown.

With the node connecting the cathode terminals of the diodes DZa, DZb driven by the bias voltage $V_{B1}$, distortion within the signal voltage $V_{SP}$ at the pad P is reduced in accordance with two factors. First, the first diode DZa has a lower voltage variation across it since the voltage follower A1 maintains approximately equal voltages at its anode and cathode terminals; therefore, the capacitance of the diode DZa remains substantially constant. Second, with the capacitance of the first diode DZa bootstrapped in this manner, its influence at the input pad P is significantly reduced. To a first approximation, the improvement in distortion is approximately equal to $(f_A/f_S)^2$, where $f_A$ is the unity gain bandwidth of the voltage follower A1 and $f_S$ is the input signal frequency. Hence, it can be seen that even relatively slow buffer amplifiers can be used to significantly decrease signal distortion.

Figure 4:
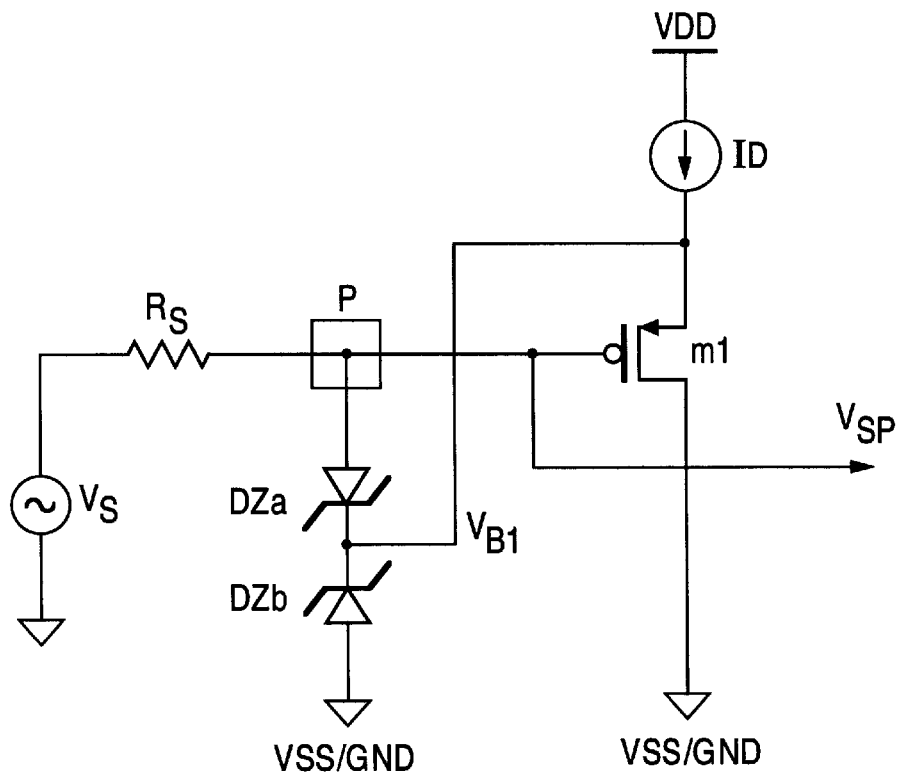
FIG. 4 is a schematic diagram of an actual implementation of the circuit of FIG. 3.

Referring to FIG. 4, a practical circuit implementation of the circuit of FIG. 3 uses a p-channel MOSFET M1 as the voltage follower amplifier A1.

Figure 5:
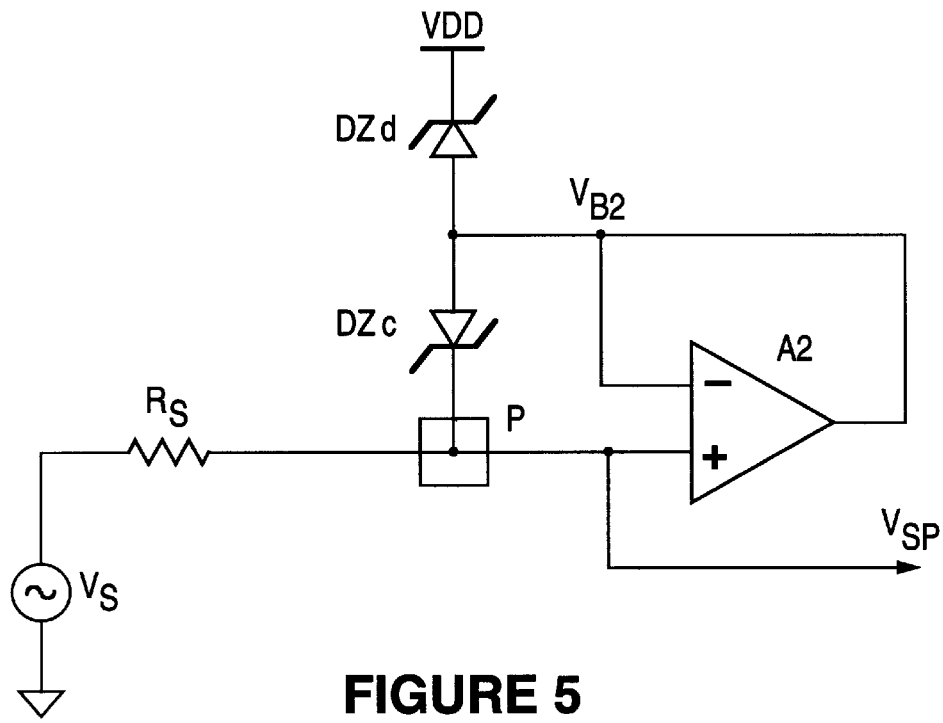
FIG. 5 is a schematic representation of an alternative embodiment of the circuit of FIG. 3.

Referring to FIG. 5, an alternative embodiment of the ESD protection circuit of FIG. 3 uses two anode connected Zener diodes DZc, DZd in series between the positive power supply node VDD and the input pad P. As before, a voltage follower amplifier A2 applies a bias voltage $V_{B2}$ to the anodes of the diodes DZc, DZd, thereby maintaining an approximately equal voltage across the first diode DZc.

Figure 6:
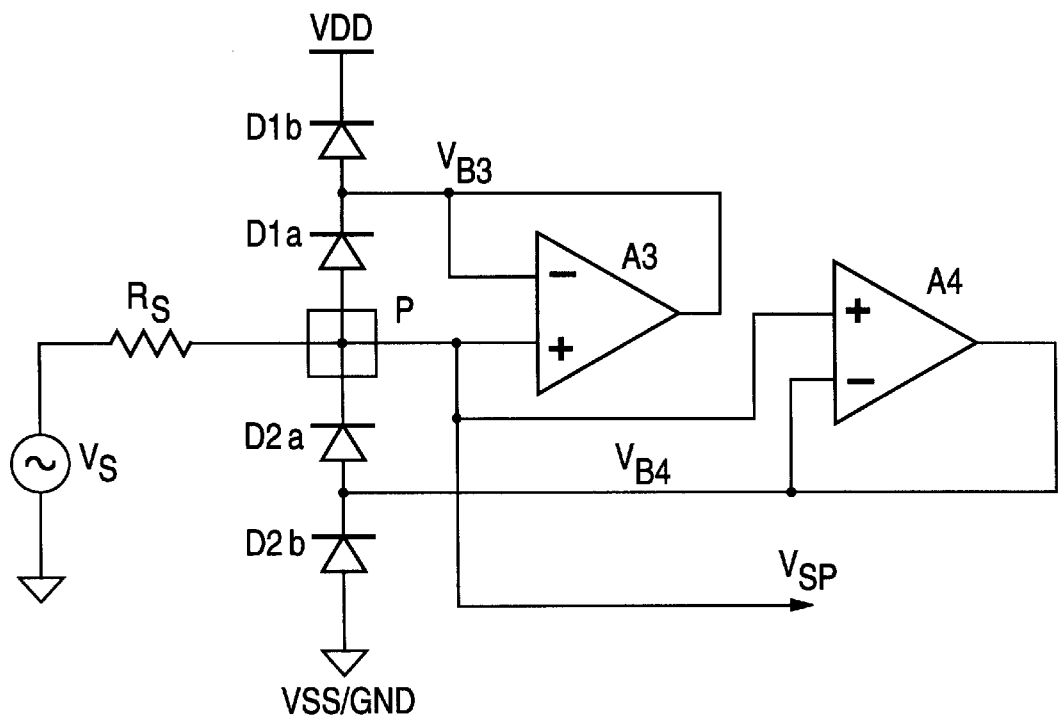
FIG. 6 is a schematic representation of an ESD protection circuit with reduced node capacitance in accordance with another embodiment of the present invention.

Referring to FIG. 6, an ESD protection circuit in accordance with another embodiment of the present invention uses one pair of serially connected diodes D1a, D1b to shunt the input pad P to the positive power supply rail VDD, and another pair of serially connected diodes D2a, D2b shunting the pad P to circuit ground VSS/GND. The first diode D1a in the first pair of diodes D1a, D1b is bootstrapped by a bias voltage $V_{B3}$ generated by a voltage follower amplifier A3 from the signal voltage $V_{SP}$ at the pad P. The first diode D2a in the second pair of diodes D2a, D2b is bootstrapped by a bias voltage $V_{B4}$ which is generated by another voltage follower amplifier A4 based upon the signal voltage $V_{SP}$. Hence, with the voltage differentials across these diodes substantially constant (i.e., $V_{B3}-V_{SP}$ for diode D1a, and $V_{B4}-V_{SP}$ for diode D2a), the capacitances of these diodes D1a, D2a remains substantially constant for signal voltages $V_{SP}$ within the range of the power supply potential VDD and circuit ground VSS/GND.

Figure 7:
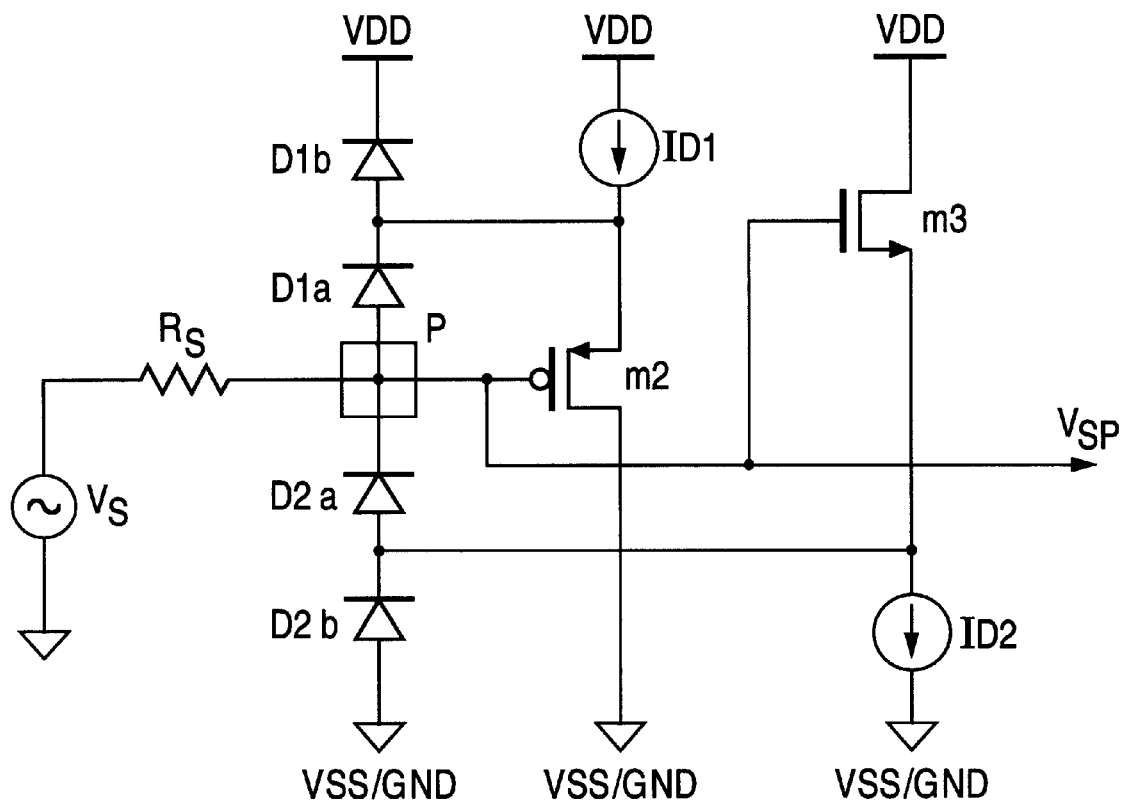
FIG. 7 is a schematic diagram of an actual implementation of the circuit of FIG. 6.

Referring to FIG. 7, a practical implementation of the ESD protection circuit of FIG. 6 uses a p-channel MOSFET M2 for the first voltage follower amplifier A3 and an n-channel MOSFET M3 for the second voltage follower amplifier A4.

For a rail-to-rail input signal voltage $V_{SP}$ range (i.e., GND-to-VDD), a rail-to-rail voltage follower An would be required for optimal operation, but since in most situations the range of the analog input voltage $V_{SP}$ is a small fraction of the power supply range (VDD-GND), the voltage follower circuit structure can be optimized as desired based upon other criteria.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an electrostatic discharge (ESD) protection circuit with a reduced node capacitance which is more linear over variations in input signal voltage, said ESD protection circuit comprising:

a first reference node configured to establish a first circuit reference potential;

a signal node configured to receive and convey a signal voltage relative to said first circuit reference potential;

a first bias node configured to receive and convey a first bias voltage relative to said first circuit reference potential;

a first impedance element, coupled between said signal node and said first bias node, with a first capacitance which is dependent upon a difference between said signal voltage and said first bias voltage;

a second impedance element, coupled between said first bias node and said first reference node, with a second capacitance which is dependent upon a difference between said first bias voltage and said first circuit reference potential, wherein said first and second impedance elements together become conductive when said signal voltage transcends a first predetermined threshold potential relative to said first circuit reference potential; and an amplifier, coupled between said signal node and said first bias node, configured to receive said signal voltage and in accordance therewith provide said first bias voltage, wherein said difference between said signal voltage and said first bias voltage remains substantially constant for a plurality of magnitudes of said signal voltage between said first circuit reference potential and a second circuit reference potential.

2. The apparatus of claim 1, wherein said first and second impedance elements comprise first and second Zener diodes.

3. The apparatus of claim 1, wherein said amplifier comprises a voltage follower circuit.

4. The apparatus of claim 1, further comprising:

a second reference node configured to establish said second circuit reference potential relative to said first circuit reference potential;

a second bias node configured to receive and convey a second bias voltage relative to said second circuit reference potential;

a third impedance element, coupled between said signal node and said second bias node, with a third capacitance which is dependent upon a difference between said signal voltage and said second bias voltage; and a fourth impedance element, coupled between said second bias node and said second reference node, with a fourth capacitance which is dependent upon a difference between said second bias voltage and said second circuit reference potential;

wherein
said third and fourth impedance elements together become conductive when said signal voltage transcends a second predetermined threshold potential relative to said second circuit reference potential, said amplifier is further coupled between said signal node and said second bias node and is further configured to receive said signal voltage and in accordance therewith provide said second bias voltage, and said difference between said signal voltage and said second bias voltage remains substantially constant for said plurality of magnitudes of said signal voltage between said first and second circuit reference potentials.

5. The apparatus of claim 4, wherein said first, second, third and fourth impedance elements comprise first, second, third and fourth diodes.

6. The apparatus of claim 4, wherein said amplifier comprises:
a first voltage follower circuit, coupled between said signal node and said first bias node, configured to receive said signal voltage and in accordance therewith provide said first bias voltage; and
a second voltage follower circuit, coupled between said signal node and said second bias node, configured to receive said signal voltage and in accordance therewith provide said second bias voltage.

7. An apparatus including an electrostatic discharge (ESD) protection circuit with a reduced node capacitance which is more linear over variations in input signal voltage, said ESD protection circuit comprising:
a first reference node configured to establish a first circuit reference potential;
a signal node configured to receive and convey a signal voltage relative to said first circuit reference potential;
a first bias node configured to receive and convey a first bias voltage relative to said first circuit reference potential;
a first diode, coupled between said signal node and said first bias node, with a first junction capacitance which is dependent upon a difference between said signal voltage and said first bias voltage;
a second diode, coupled between said first bias node and said first reference node, with a second junction capacitance which is dependent upon a difference between said first bias voltage and said first circuit reference potential, wherein said first and second diodes together become conductive when said signal voltage transcends a first predetermined threshold potential relative to said first circuit reference potential; and
an amplifier, coupled between said signal node and said first bias node, configured to receive said signal voltage and in accordance therewith provide said first bias voltage, wherein said difference between said signal voltage and said first bias voltage remains substantially constant for a plurality of magnitudes of said signal voltage between said first circuit reference potential and a second circuit reference potential.

8. The apparatus of claim 7, wherein said amplifier comprises a voltage follower circuit.

9. The apparatus of claim 7, further comprising:
a second reference node configured to establish said second circuit reference potential relative to said first circuit reference potential;

a second bias node configured to receive and convey a second bias voltage relative to said second circuit reference potential;
a third diode, coupled between said signal node and said second bias node, with a third junction capacitance which is dependent upon a difference between said signal voltage and said second bias voltage; and
a fourth diode, coupled between said second bias node and said second reference node, with a fourth junction capacitance which is dependent upon a difference between said second bias voltage and said second circuit reference potential;

wherein
said third and fourth diodes together become conductive when said signal voltage transcends a second predetermined threshold potential relative to said second circuit reference potential, said amplifier is further coupled between said signal node and said second bias node and is further configured to receive said signal voltage and in accordance therewith provide said second bias voltage, and said difference between said signal voltage and said second bias voltage remains substantially constant for said plurality of magnitudes of said signal voltage between said first and second circuit reference potentials.

10. The apparatus of claim 9, wherein said amplifier comprises:
a first voltage follower circuit, coupled between said signal node and said first bias node, configured to receive said signal voltage and in accordance therewith provide said first bias voltage; and
a second voltage follower circuit, coupled between said signal node and said second bias node, configured to receive said signal voltage and in accordance therewith provide said second bias voltage.

11. A method of protecting a circuit signal node from electrostatic discharge (ESD) with a reduced node capacitance which is more linear over variations in input signal voltage, said method comprising the steps of:
receiving a signal voltage relative to a first circuit reference potential;
generating a first bias voltage in accordance with said signal voltage, wherein a difference between said signal voltage and said first bias voltage remains substantially constant for a plurality of magnitudes of said signal voltage between said first circuit reference potential and a second circuit reference potential;
applying said signal voltage and said first bias voltage together across a first impedance element with a first capacitance which is dependent upon said difference between said signal voltage and said first bias voltage;
applying said first bias voltage to a second impedance element with a second capacitance which is dependent upon a difference between said first bias voltage and said first circuit reference potential;
generating a first current in accordance with said signal voltage; and
conducting said first current serially through said first and second impedance elements when said signal voltage transcends a first predetermined threshold potential relative to said first circuit reference potential.

12. A method of protecting a circuit signal node from electrostatic discharge (ESD) with a reduced node capacitance which is more linear over variations in input signal voltage, said method comprising the steps of:

receiving a signal voltage relative to a first circuit reference potential;

generating a first bias voltage in accordance with said signal voltage, wherein a difference between said signal voltage and said first bias voltage remains substantially constant for a plurality of magnitudes of said signal voltage between said first circuit reference potential and a second circuit reference potential;

applying said signal voltage and said first bias voltage together across a first diode with a first junction capacitance which is dependent upon said difference between said signal voltage and said first bias voltage;

applying said first bias voltage to a second diode with a second junction capacitance which is dependent upon a difference between said first bias voltage and said first circuit reference potential;

generating a first current in accordance with said signal voltage; and conducting said first current serially through said first and second diodes when said signal voltage transcends a first predetermined threshold potential relative to said first circuit reference potential.

13. A method of protecting a circuit signal node from electrostatic discharge (ESD) with a reduced node capacitance which is more linear over variations in input signal voltage, said method comprising the steps of:

receiving a signal voltage relative to a first circuit reference potential;

generating a first bias voltage in accordance with said signal voltage, wherein a difference between said signal voltage and said first bias voltage remains substantially constant for a plurality of magnitudes of said signal voltage between said first circuit reference potential and a second circuit reference potential;

applying said signal voltage and said first bias voltage together across a first impedance element with a first capacitance which is dependent upon said difference between said signal voltage and said first bias voltage;

applying said first bias voltage to a second impedance element with a second capacitance which is dependent upon a difference between said first bias voltage and said first circuit reference potential; and conducting a first current serially through said first and second impedance elements when said signal voltage transcends a first predetermined threshold potential relative to said first circuit reference potential by conducting said first current serially through first and second Zener diodes when said signal voltage transcends said first predetermined threshold potential relative to said first circuit reference potential.

14. A method of protecting a circuit signal node from electrostatic discharge (ESD) with a reduced node capacitance which is more linear over variations in input signal voltage, said method comprising the steps of:

receiving a signal voltage relative to a first circuit reference potential;

generating a first bias voltage in accordance with said signal voltage, wherein a difference between said signal voltage and said first bias voltage remains substantially constant for a plurality of magnitudes of said signal voltage between said first circuit reference potential and a second circuit reference potential, by generating said first bias voltage such that said first bias voltage is approximately equal to said signal voltage for said plurality of magnitudes of said signal voltage between said first and second circuit reference potentials;

applying said signal voltage and said first bias voltage together across a first impedance element with a first capacitance which is dependent upon said difference between said signal voltage and said first bias voltage;

applying said first bias voltage to a second impedance element with a second capacitance which is dependent upon a difference between said first bias voltage and said first circuit reference potential; and conducting a first current serially through said first and second impedance elements when said signal voltage transcends a first predetermined threshold potential relative to said first circuit reference potential.

15. A method of protecting a circuit signal node from electrostatic discharge (ESD) with a reduced node capacitance which is more linear over variations in input signal voltage, said method comprising the steps of:

receiving a signal voltage relative to a first circuit reference potential;

generating a first bias voltage in accordance with said signal voltage, wherein a difference between said signal voltage and said first bias voltage remains substantially constant for a plurality of magnitudes of said signal voltage between said first circuit reference potential and a second circuit reference potential;

applying said signal voltage and said first bias voltage together across a first impedance element with a first capacitance which isdependent upon said difference between said signal voltage and said first bias voltage;

applying said first bias voltage to a second impedance element with a second capacitance which is dependent upon a difference between said first bias voltage and said first circuit reference potential;

conducting a first current serially through said first and second impedance elements when said signal voltage transcends a first predetermined threshold potential relative to said first circuit reference potential;

generating a second bias voltage in accordance with said signal voltage, wherein a difference between said signal voltage and said second bias voltage remains substantially constant for said plurality of magnitudes of said signal voltage between said first and second circuit reference potentials;

applying said signal voltage and said second bias voltage together across a third impedance element with a third capacitance which is dependent upon said difference between said signal voltage and said second bias voltage;

applying said second bias voltage to a fourth impedance element with a fourth capacitance which is dependent upon a difference between said second bias voltage and said second circuit reference potential; and conducting a second current serially through said third and fourth impedance elements when said signal voltage transcends a second predetermined threshold potential relative to said second circuit reference potential.

16. The method of claim 15, wherein:

said step of conducting a first current serially through said first and second impedance elements when said signal voltage transcends a first predetermined threshold potential relative to said first circuit reference potential comprises conducting said first current serially through first and second diodes when said signal voltage transcends said first predetermined threshold potential relative to said first circuit reference potential; and said step of conducting a second current serially through said third and fourth impedance elements when said signal voltage transcends a second predetermined threshold potential relative to said second circuit reference potential comprises conducting said second current serially through third and fourth diodes when said signal voltage transcends said second predetermined threshold potential relative to said second circuit reference potential.

17. The method of claim 15, wherein:

said step of generating a first bias voltage in accordance with said signal voltage comprises generating said first bias voltage such that said first bias voltage is approximately equal to said signal voltage for said plurality of magnitudes of said signal voltage between said first and second circuit reference potentials; and said step of generating a second bias voltage in accordance with said signal voltage comprises generating said second bias voltage such that said second bias voltage is approximately equal to said signal voltage for said plurality of magnitudes of said signal voltage between said first and second circuit reference potentials.

18. A method of protecting a circuit signal node from electrostatic discharge (ESD) with a reduced node capacitance which is more linear over variations in input signal voltage, said method comprising the steps of:

receiving a signal voltage relative to a first circuit reference potential;

generating a first bias voltage in accordance with said signal voltage, wherein a difference between said signal voltage and said first bias voltage remains substantially constant for a plurality of magnitudes of said signal voltage between said first circuit reference potential and a second circuit reference potential, by generating said first bias voltage such that said first bias voltage is approximately equal to said signal voltage for said plurality of magnitudes of said signal voltage between said first and second circuit reference potentials;

applying said signal voltage and said first bias voltage together across a first diode with a first junction capacitance which is dependent upon said difference between said signal voltage and said first bias voltage;

applying said first bias voltage to a second diode with a second junction capacitance which is dependent upon a difference between said first bias voltage and said first circuit reference potential; and conducting a first current serially through said first and second diodes when said signal voltage transcends a first predetermined threshold potential relative to said first circuit reference potential.

19. A method of protecting a circuit signal node from electrostatic discharge (ESD) with a reduced node capacitance which is more linear over variations in input signal voltage, said method comprising the steps of:

receiving a signal voltage relative to a first circuit reference potential;

generating a first bias voltage in accordance with said signal voltage, wherein a difference between said signal voltage and said first bias voltage remains substantially constant for a plurality of magnitudes of said signal voltage between said first circuit reference potential and a second circuit reference potential;

applying said signal voltage and said first bias voltage together across a first diode with a first junction capacitance which is dependent upon said difference between said signal voltage and said first bias voltage;

applying said first bias voltage to a second diode with a second junction capacitance which is dependent upon a difference between said first bias voltage and said first circuit reference potential;

conducting a first current serially through said first and second diodes when said signal voltage transcends a first predetermined threshold potential relative to said first circuit reference potential;

generating a second bias voltage in accordance with said signal voltage, wherein a difference between said signal voltage and said second bias voltage remains substantially constant for said plurality of magnitudes of said signal voltage between said first and second circuit reference potentials;

applying said signal voltage and said second bias voltage together across a third diode with a third junction capacitance which is dependent upon said difference between said signal voltage and said second bias voltage;

applying said second bias voltage to a fourth diode with a fourth junction capacitance which is dependent upon a difference between said second bias voltage and said second circuit reference potential; and conducting a second current serially through said third and fourth diodes when said signal voltage transcends a second predetermined threshold potential relative to said second circuit reference potential.

20. The method of claim 19, wherein:

said step of generating a first bias voltage in accordance with said signal voltage comprises generating said first bias voltage such that said first bias voltage is approximately equal to said signal voltage for said plurality of magnitudes of said signal voltage between said first and second circuit reference potentials; and said step of generating a second bias voltage in accordance with said signal voltage comprises generating said second bias voltage such that said second bias voltage is approximately equal to said first bias voltage for said plurality of magnitudes of said signal voltage between said first and second circuit reference potentials.

* * * * *